US012666887B2

(12) United States Patent
Blanquart

(10) Patent No.: US 12,666,887 B2
(45) Date of Patent: Jun. 23, 2026

(54) METHODS FOR DEPOSITING GAP-FILLING FLUIDS AND RELATED SYSTEMS AND DEVICES

(71) Applicant: ASM IP Holding B.V., Almere (NL)

(72) Inventor: Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/571,835

(22) Filed: Jan. 10, 2022

(65) Prior Publication Data

US 2022/0223411 A1      Jul. 14, 2022

Related U.S. Application Data

(60) Provisional application No. 63/136,809, filed on Jan. 13, 2021.

(51) Int. Cl.
| | |
|---|---|
| *H10P 14/60* | (2026.01) |
| *B05D 1/00* | (2006.01) |
| *H10P 76/40* | (2026.01) |
| *B05D 1/38* | (2006.01) |
| *G03F 7/11* | (2006.01) |

(52) U.S. Cl.
CPC ............ *H10P 14/6336* (2026.01); *B05D 1/62* (2013.01); *H10P 14/6339* (2026.01); *H10P 76/405* (2026.01); *B05D 1/38* (2013.01); *B05D 1/60* (2013.01); *G03F 7/11* (2013.01)

(58) Field of Classification Search
CPC ........... H01L 21/02274; H01L 21/0228; H01L 21/0332; H01L 21/32055; H01L 21/0262;

H01L 21/02532; H01L 21/02592; B05D 1/62; B05D 1/38; B05D 1/60; G03F 7/11; C23C 16/24; C23C 16/45538; C23C 16/45542; C23C 16/45544; C23C 16/45553; C23C 16/509; C23C 16/045; C23C 16/4554; H01P 14/6336; H01P 14/6339; H01P 76/405; H01P 14/416; H01P 14/3411; H01P 14/3454; H01P 14/24
See application file for complete search history.

(56) References Cited

U.S. PATENT DOCUMENTS

| | | | |
|---|---|---|---|
| 8,901,016 B2 | 12/2014 | Ha | |
| 9,163,310 B2 | 10/2015 | Lee | |
| 10,388,513 B1 | 8/2019 | Blanquart | |
| 10,626,495 B2 | 4/2020 | Cheng et al. | |
| 10,867,788 B2 | 12/2020 | Blanquart et al. | |
| 11,482,412 B2 | 10/2022 | Blanquart | |
| 12,054,827 B2 | 8/2024 | Jiang et al. | |
| 2012/0149213 A1* | 6/2012 | Nittala | ............. H01L 21/67207 |
| | | | 257/E21.24 |

(Continued)

FOREIGN PATENT DOCUMENTS

| | | | |
|---|---|---|---|
| WO | 2017223323 A1 | 12/2017 | |
| WO | WO-2019142055 A2 * | 7/2019 | ........... C23C 16/045 |
| WO | WO-2019195188 A1 * | 10/2019 | ............. C23C 16/24 |

*Primary Examiner* — Gordon Baldwin
*Assistant Examiner* — Christina D McClure
(74) *Attorney, Agent, or Firm* — Snell & Wilmer L.L.P.

(57) ABSTRACT

Methods and systems for manufacturing a structure comprising a substrate. The substrate comprises plurality of recesses. The recesses are at least partially filled with a gap filling fluid. The gap filling fluid comprises a Si—H bond.

17 Claims, 6 Drawing Sheets

(56)     References Cited

U.S. PATENT DOCUMENTS

| | | | |
|---|---|---|---|
| 2013/0217239 A1* | 8/2013 | Mallick | H01L 21/02348 |
| | | | 438/778 |
| 2013/0244446 A1* | 9/2013 | Tsuji | H01L 21/0228 |
| | | | 438/778 |
| 2014/0273527 A1* | 9/2014 | Niskanen | H01L 21/02274 |
| | | | 438/792 |
| 2016/0020092 A1* | 1/2016 | Kang | H01J 37/32917 |
| | | | 438/789 |
| 2016/0079054 A1* | 3/2016 | Chen | C23C 16/45536 |
| | | | 438/762 |
| 2016/0122869 A1* | 5/2016 | Lei | C23C 16/401 |
| | | | 546/14 |
| 2016/0276150 A1* | 9/2016 | Xue | H01L 21/76829 |
| 2018/0182613 A1* | 6/2018 | Blanquart | H01L 21/02164 |
| 2018/0350668 A1* | 12/2018 | Cheng | C23C 16/045 |
| 2020/0105605 A1* | 4/2020 | Teng | H01L 29/7853 |
| 2021/0013037 A1 | 1/2021 | Sun | |
| 2021/0111025 A1 | 4/2021 | Ivan | |
| 2022/0122841 A1* | 4/2022 | Blanquart | C23C 16/045 |
| 2022/0351940 A1* | 11/2022 | Fields | C23C 16/505 |

* cited by examiner (a)                                        (b)

METHODS FOR DEPOSITING GAP-FILLING FLUIDS AND RELATED SYSTEMS AND DEVICES

CROSS-REFERENCE TO RELATED APPLICATIONS

This application claims priority to U.S. Provisional Patent Application Ser. No. 63/136,809 filed Jan. 13, 2021 titled METHODS FOR DEPOSITING GAP-FILLING FLUIDS AND RELATED SYSTEMS AND DEVICES, the disclosure of which is hereby incorporated by reference in its entirety.

FIELD OF INVENTION

The present disclosure generally relates to methods and systems suitable for forming electronic devices. More particularly, the disclosure relates to methods and systems that can be used for depositing a material in gaps, trenches, and the like by plasma-assisted deposition.

BACKGROUND OF THE DISCLOSURE

Amorphous silicon has been widely used in semiconductor fabrication processes as a sacrificial layer since it can provide good etch selectivity with respect to other films (e.g., silicon oxide, amorphous carbon, etc.). With decreasing critical dimensions (CD) in semiconductor fabrication, methods for filling high aspect ratio gaps become increasingly critical for advanced semiconductor device fabrication.

For example, current metal replacement gate processes involve a furnace poly-silicon or amorphous silicon dummy gate. A seam forms in the middle of the Si dummy gate due to the nature of the process. This seam may be opened up during the post process and cause structure failure. Conventional plasma-enhanced chemical vapor deposition (PECVD) of amorphous silicon (a-Si) forms a "mushroom shape" film on top of the narrow trenches. This is caused by the inability of the plasma to penetrate into the deep trenches. The results in pinching-off the narrow trench from the top; forming a void at the bottom of the trench. Therefore, there is a need for methods for filling high aspect ratio structures without void formation.

Any discussion, including discussion of problems and solutions, set forth in this section has been included in this disclosure solely for the purpose of providing a context for the present disclosure. Such discussion should not be taken as an admission that any or all of the invention was previously known or otherwise constitutes prior ar.

SUMMARY OF THE DISCLOSURE

Various embodiments of the present disclosure relate to gap filling methods, to structures and devices formed using such methods, and to apparatus for performing the methods and/or for forming the structure and/or devices. The ways in which various embodiments of the present disclosure address drawbacks of prior methods and systems are discussed in more detail below.

Further described herein is a method of filling a gap. The method comprises introducing a substrate in a reaction chamber. The substrate is provided with a gap. The method comprises introducing silicon precursor into the reaction chamber. The silicon precursor comprises silicon and a halogen. The method further comprises generating a plasma in the reaction chamber and introducing a reactant into the reaction chamber. The reactant comprises a noble gas. The gap filling fluid comprises silicon and hydrogen. The silicon precursor and the reactant react in the presence of the plasma to form a gap filling fluid that at least partially fills a gap. Thus, a gap filling fluid is deposited on the substrate.

Further disclosed herein is another method of filling a gap. The method comprises introducing a substrate in a reaction chamber. The substrate is provided with a gap. The method further comprises depositing a gap filling fluid by executing a cyclical deposition process. The cyclical deposition process comprises a plurality of deposition cycles. A deposition cycle comprises a precursor pulse and a plasma pulse. It shall be understood that the precursor pulse and the plasma pulse are at least partially separated, i.e. at least partially non-overlapping, in time and/or in space. Thus, the precursor pulse and the plasma pulse may be performed consecutively. Additionally or alternatively, the precursor pulse and the plasma pulse may be performed in different parts of a reaction chamber. The precursor pulse comprises introducing a silicon precursor into the reaction chamber. The silicon precursor comprises silicon and a halogen. The plasma pulse comprises generating a plasma in the reaction chamber and introducing a reactant into the reaction chamber. The reactant comprises a noble gas. The silicon precursor and the reactant react in the presence of the plasma to form a gap filling fluid that at least partially fills the gap. The gap filling fluid comprises silicon and hydrogen.

In some embodiments, the silicon precursor comprises a compound having a chemical formula of $Si_nH_{2n+2-m}X_m$, wherein X is the halogen, n is from at least 1 to at most 3, and m is from at least 1 to at most 2n+2.

In some embodiments, the halogen comprises I.

In some embodiments, the silicon precursor comprises $SiI_2H_2$.

In some embodiments, the reactant comprises the noble gas and $H_2$.

In some embodiments, the cyclical deposition process is carried out at a temperature of at least −25° C. to at most 150° C.

In some embodiments, the cyclical deposition process is carried out at a pressure of at least 500 Pa.

In some embodiments, the noble gas is selected from the group consisting of He, Ne, Ar, and Kr.

In some embodiments, the noble gas is Ar.

In some embodiments, the precursor pulse and the plasma pulse are separated by an intra-cycle purge.

In some embodiments, subsequent cycles are separated by an inter-cycle purge.

In some embodiments, the precursor pulse and the plasma pulse at least partially overlap.

In some embodiments, the silicon precursor substantially consists of silicon, hydrogen, and one or more halogens.

In some embodiments, no gasses other than the silicon precursor, the noble gas, and H are introduced into the reaction chamber during the silicon precursor pulse and during the plasma pulse.

In some embodiments, no gasses other than the noble gas or H are introduced into the reaction chamber during the intra-cycle purge and during the inter-cycle purge.

In some embodiments, the substrate comprises a semiconductor.

In some embodiments, the method comprises one or more super cycles, a super cycle comprising a step of depositing the gap filling fluid and a curing step.

In some embodiments, the gap filling fluid further comprises the halogen.

In some embodiments, depositing the gap filling fluid is followed by curing the gap filling fluid.

In some embodiments, the method further comprises a step of forming a cap layer on the gap filling fluid.

In some embodiments, the step of forming a cap layer on the gap filling fluid comprises a cyclical process. The cyclical process comprises a plurality of cycles. A cycle comprises a cap layer precursor pulse and a cap layer plasma pulse. The cap layer precursor pulse comprises providing a cap layer precursor to the reaction chamber. The cap layer plasma pulse comprises providing a cap layer reactant to the reaction chamber. The cap layer plasma pulse comprises generating a cap layer plasma in the reaction chamber.

In some embodiments, the step of forming a cap layer on the gap filling fluid comprises a step of simultaneously providing a cap layer precursor and a cap layer reactant to the reaction chamber while generating a cap layer plasma in the reaction chamber.

Further described herein is a system that comprises a reaction chamber, a radio frequency power source, a gas injection system, a precursor gas source, a reactant gas source, an exhaust, and a controller. The reaction chamber comprises a substrate support and an upper electrode. The substrate support comprises a lower electrode. The radio frequency power source is arranged for generating a radio frequency power waveform. The gas injection system is fluidly coupled to the reaction chamber. The precursor gas source is arranged for introducing a silicon precursor and optionally a carrier gas in the reaction chamber. The reactant gas source is arranged for introducing a reactant in the reaction chamber. The controller is arranged for causing the system to carry out a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
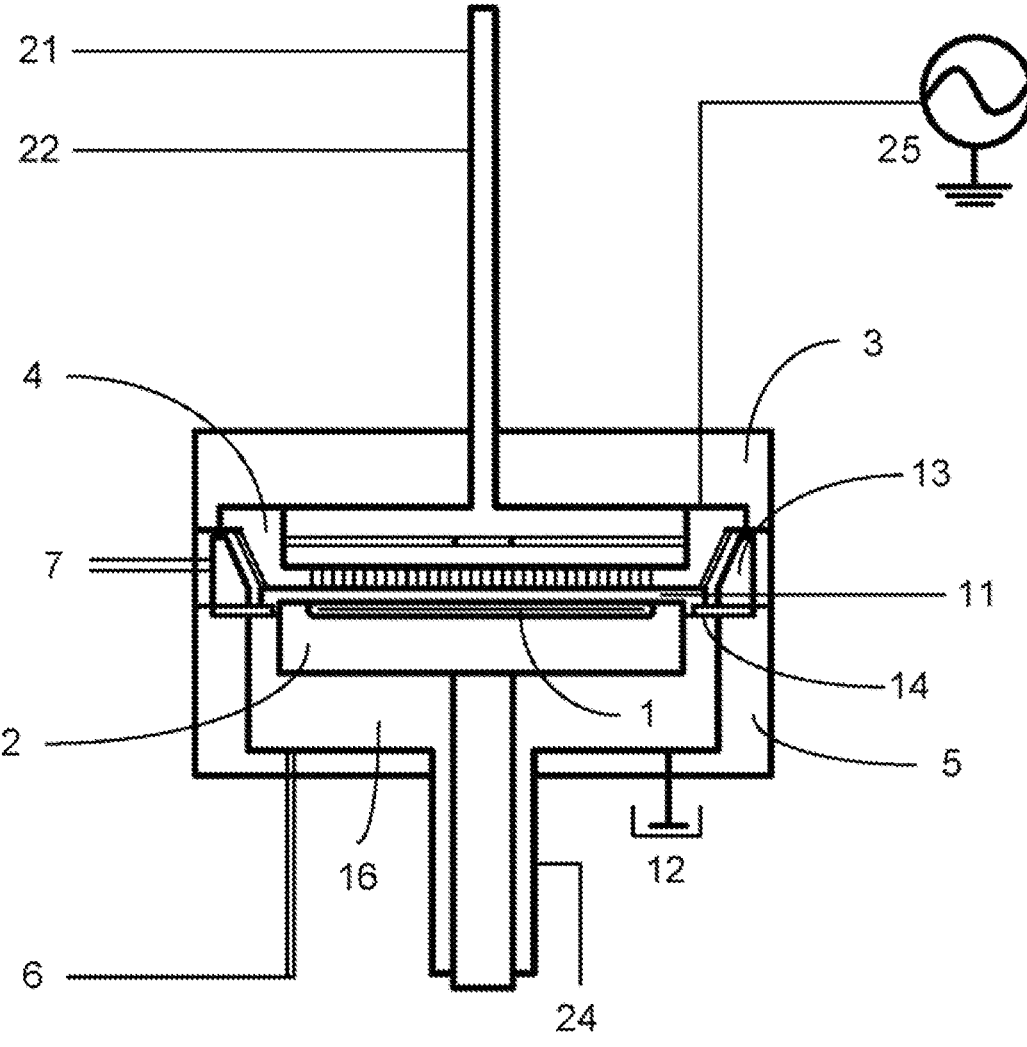
FIG. 1 is a schematic representation of a plasma-enhanced atomic layer deposition (PEALD) apparatus suitable for depositing a structure and/or for performing a method in accordance with at least one embodiment of the present disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. The terms "rare gas" and "noble gas" as used herein may be used interchangeably. In some cases, the term "precursor" can refer to a compound that participates in the chemical reaction that produces another compound, and particularly to a compound that constitutes a film matrix or a main skeleton of a film; the term "reactant" may be used interchangeably with the term precursor.

In some embodiments, the term "reactant" refers to a gas which can react and/or interact with a precursor in order to form a flowable gap fill layer as described herein. The reactant may activate precursor oligomerization. The reactant may be a catalyst. The reactant does not necessarily have to be incorporated in the gap filling fluid which is formed, though the reactant does interact with the precursor during formation of the gap filling fluid. In other words, in some embodiments the reactant is incorporated in the gap filling fluid whereas in other embodiments, the reactant is not incorporated in the gap filling fluid. Possible reactants include noble gasses, which can be brought in an excited state, in particular an excited state such as ion and/or radical induced by means of a plasma, such as He and Ar, as well as other gasses such as $H_2$. Alternative expressions for the term "reactant" as used herein may include "reactant", "gas mixture", "one or more further gasses", and "gas mixture comprising one or more further gasses".

In some embodiments, the term "substrate" can refer to any underlying material or materials that can be used to form a device, a circuit, or a film, or upon which a device, a circuit, or a film can be formed. A substrate can include a bulk material, such as silicon (e.g., single-crystal silicon), other Group IV materials, such as germanium, or other semiconductor materials, such as a Group II-VI or Group III-V semiconductor, and can include one or more layers overlying or underlying the bulk material.

It shall be understood that terms like "depositing" and the like as used herein can refer to a phase change from the gas phase to a solid phase change, through an intermediate flowable phase. Indeed, the meaning of the term "depositing" can include phase changes from a gaseous phase to a liquid phase, and can include processes in which gaseous reactants form liquid, liquid-like, or solidifying fluids. Thus, the meaning of the term "depositing" can encompass similar terms like condensing or forming.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

As used herein, the term "comprising" indicates that certain features are included, but that it does not exclude the presence of other features, as long as they do not render the claim unworkable. In some embodiments, the term "comprising" includes "consisting."

As used herein, the term "consisting" indicates that no further features are present in the apparatus/method/product apart from the ones following said wording. When the term "consisting" is used referring to a chemical compound, substance, or composition of matter, it indicates that the chemical compound, substance, or composition of matter only contains the components which are listed. This notwithstanding, the chemical compound, substance, or composition of matter may, in some embodiments, comprise other components as trace elements or impurities, apart from the components that are listed.

In some embodiments, the term "gap filling fluid", also referred to as "flowable gap fill", may refer to an oligomer which is liquid under the conditions under which is deposited on a substrate and which has the capability to cross link and for a solid film.

In some embodiments, the term "filling capability" may refer to a capability of filling a gap substantially without voids (e.g., no void having a size of approximately 5 nm or greater in diameter) and seams (e.g. no seam having a length of approximately 5 nm or greater), wherein seamless/void less bottom-up growth of a layer is observed. In some embodiments, the growth at a bottom of a gap may be at least approximately 1.5 times faster than growth on sidewalls of the gap and on a top surface having the gap. A film having filling capability can be referred to as "flowable film" or "viscous film". The flowable or viscous behavior of a film is often manifested as a concave surface at a bottom of a trench.

In this disclosure, a recess between adjacent protruding structures and any other recess pattern may be referred to as a "trench." That is, a trench may refer to any recess pattern including a hole/via. A trench can have, in some embodiments, a width of about 5 nm to about 150 nm, or about 30 nm to about 50 nm, or about 5 nm to about 10 nm, or about 10 nm to about 20 nm, or about 20 nm to about 30 nm, or about 50 nm to about 100 nm, or about 100 nm to about 150 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a trench has an aspect ratio of about 2 to about 10, and typically of about 2 to about 5. The dimensions of the trench may vary depending on process conditions, film composition, intended application, etc.

When specific process conditions are provided in this disclosure, they are provided for a reaction chamber volume of 1 liter and for 300 mm wafers. The skilled person understands that these values can be readily extended to other reaction chamber volumes and wafer sizes.

Described herein is a method for filling a gap by means of a gap filling fluid comprising silicon and hydrogen. A gap in a substrate may refer to a patterned recess or trench in a substrate. Also provided are gap filling fluids produced by means of the presently described methods, films resulting from such methods, and structures including such films. In some embodiments, the filling capability can be accomplished by forming a viscous material in a gas phase by striking, for example, a noble gas plasma, or a plasma comprising a noble gas and hydrogen in a chamber filled with a volatile precursor that can be polymerized within certain parameter ranges. The gap filling fluid can be used during manufacturing processes of various semiconductor devices including, but not limited to, cell isolation in 3D cross point memory devices, self-aligned via, dummy gate, reverse tone patterning, PC RAM isolation, cut hard mask, and DRAM storage node contact (SNC) isolation.

In particular, the presently described method comprises introducing a substrate in a reaction chamber. The substrate is provided with a gap. The method comprises forming a gap filling fluid that at least partially fills the gap. Forming the gap filling fluid can comprise continuously providing a silicon precursor to a reaction chamber. Additionally alternatively, the forming the gap filling fluid can comprise continuously generating a plasma in the reaction chamber. This notwithstanding, and in some embodiments, at least one of providing a silicon precursor to the reaction chamber and generating a plasma in the reaction chamber can occur intermittently, i.e. in pulses. In some embodiments, the reactant is continuously provided to the reaction chamber, whereas providing the silicon precursor to the reaction chamber and generating a plasma in the reaction chamber is done in alternating cycles.

In some embodiments, the method includes entirely filling the gap with a gap filling fluid. In some embodiments, the method includes filling the gap with gap filling fluid without the formation of voids or seams. In other words, in some embodiments, the deposition according to the present methods is continued until the gap is fully filled with a material having filling capability, and substantially no voids or seams are formed in the filled gap. The presence of voids or seams can be observed by studying the formed material in a scanning tunneling electron microscope.

In some embodiments, the gap has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the gap has a width of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap has a length of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap filling fluid extends into a particular gap for a distance that equals from at least 1.0 to at most 10.0 times the width of the gap. In some embodiments, the gap filling fluid extends into a particular gap for a distance that equals from at least 1.5 to at most 9.0 times the width of the gap. In some embodiments, the gap filling fluid extends into a particular gap for a distance that equals from at least 2.0 to at most 8.0 times the width of the gap. In some embodiments, the gap filling fluid extends into a particular gap for a distance that equals from at least 3.0 to at most 6.0 times the width of the gap. In some embodiments, the gap filling fluid extends into a particular gap for a distance that equals from at least 4.0 to at most 6.0 times the width of the gap. In some embodiments, the gap filling fluid extends into a particular gap for a distance that equals about 5.0 times the width of the gap. In other words, and in some embodiments, the gap filling fluid fills the gap up to any one of the aforementioned distances from the bottom of the gap.

In some embodiments, forming the gap filling fluid comprises introducing silicon precursor into the reaction chamber; generating a plasma in the reaction chamber; and, introducing a reactant into the reaction chamber. Thus, the silicon precursor and the reactant react in the presence of the plasma to form a gap filling fluid that at least partially fills the gap. It shall be understood that the resulting gap filling fluid comprises silicon and hydrogen.

In some embodiments, the silicon precursor is continuously provided to the reaction chamber. In some embodiments, the silicon precursor is continuously provided to the reaction chamber and at least one of generating the plasma in the reaction chamber and providing the reactant to the reaction chamber is done intermittently.

In some embodiments, the reactant is continuously provided to the reaction chamber. In some embodiments, the reactant is continuously provided to the reaction chamber and at least one of generating the plasma in the reaction chamber and providing the precursor to the reaction chamber is done intermittently.

In some embodiments, the plasma is continuously generated to the reaction chamber. In some embodiments the plasma is continuously generated to the reaction chamber and at least one of providing the precursor to the reaction chamber and providing the reactant to the reaction chamber is done intermittently.

In some embodiments, no gasses other than the silicon precursor and the reactant are introduced into the reaction chamber while forming the gap filling fluid.

In some embodiments, the present methods comprise providing the precursor intermittently to the reaction space, and continuously applying a plasma. Thus, in some embodiments, a continuous plasma is used instead of plasma pulses. In some embodiments, the present methods involve providing the precursor intermittently to the reaction space, and intermittently applying a plasma. Thus, in some embodiments, silicon precursor is continuously provided to the reaction chamber whereas a plasma is generated intermittently.

In some embodiments, the present methods comprise continuously providing the precursor and the reactant to the reaction chamber, and continuously generating a plasma in the reaction chamber, e.g. through application of RF power, while forming the gap filling fluid.

In some embodiments, a pulsed plasma, e.g. a pulsed RF plasma is generated in the reaction chamber. Thus, the method comprises a plurality of cycles, a cycle comprising a plasma on pulse and a plasma off pulse. In some embodiments, a plasma on pulse lasts from at least 0.7 seconds to at most 2.0 seconds, for example from at least 0.7 seconds to at most 1.5 seconds. In some embodiments, a plasma off pulse lasts from at least 0.7 seconds to at most 2.0 seconds, for example from at least 0.7 seconds to at most 1.5 seconds.

In some embodiments, the reactant is supplied to the reaction chamber as a carrier gas, i.e. as a gas that entrains the precursor, and/or as an additional gas. In some embodiments, the carrier gas is provided at a flow rate of at least 0.2 to at most 2.0 slpm, or from at least 0.3 to at most 1.5 slpm, or from at least 0.4 to at most 1.0 slpm, or from at least 0.5 to at most 0.7 slpm.

In some embodiments, forming the gap filling fluid comprises executing a cyclical deposition process. The cyclical deposition process comprises executing a plurality of deposition cycles. A deposition cycle comprises a precursor pulse and a plasma pulse. The precursor pulse comprises introducing a silicon precursor into the reaction chamber. The plasma pulse comprises generating a plasma in the reaction chamber and introducing a reactant into the reaction chamber. In some embodiments, the plasma pulse can comprise a step in which the plasma is generated while the reactant is being introduced in the reaction chamber. Additionally or alternatively, the plasma pulse can comprise a reactant introduction step followed by a plasma strike step. During the reactant introduction step, the reactant is provided to the reaction chamber. During the plasma strike step, a plasma is generated in the reaction chamber. Thus, the precursor and the reactant are allowed to react in the presence of the plasma to form a gap filling fluid that fills the gap at least to some extent. The gap filling fluid comprises silicon and hydrogen. In some embodiments, the gap filling fluid further comprises a halogen. If desired, the deposition cycle can be repeated one or more times until a suitable amount of gap filling fluid has been deposited in the gap.

In some embodiments, the gap is entirely filled with the gap filling fluid. It shall be understood that the gap filling fluid can be described as a viscous material, i.e. a viscous phase that is deposited on the substrate. The gap filling fluid is capable of flowing in a trench on the substrate. Suitable substrates include silicon wafers. As a result, the viscous material seamlessly fills the trench in a bottom-up way.

In some embodiments, the method for filling a gap comprises from at least 10 to at most 30000 deposition cycles, or from at least 10 to at most 3000 deposition cycles, or from at least 10 to at most 1000 deposition cycles, or from at least 10 to at most 500 deposition cycles, or from at least 20 to at most 200 deposition cycles, or from at least 50 to at most 150 deposition cycles, or from at least 75 to at most 125 deposition cycles, for example 100 deposition cycles.

In some embodiments, the precursor pulse and the plasma pulse at least partially overlap. In other words, and in some embodiments, the precursor pulse and the plasma pulse occur at least partially simultaneously. In such embodiments, the cyclical deposition process does not contain an intra-cycle purge. In some embodiments, the cyclical deposition process does not contain an inter-cycle purge.

In some embodiments, no gasses other than the silicon precursor, the noble gas, and H are introduced into the reaction chamber during the silicon precursor pulse and during the plasma pulse. Additionally or alternatively, and in some embodiments, no gasses other than the noble gas or H are introduced into the reaction chamber during at least one of the intra-cycle purge and the inter-cycle purge.

In some embodiment, the reaction chamber is not purged between the precursor pulse and the plasma pulse. Nevertheless, in some embodiments, the precursor pulse and the plasma pulse can be separated by an intra-cycle purge. Note that, in this case, the intra-cycle purge is kept sufficiently short such as not to dilute the precursor concentration in the reaction chamber to an appreciable extent. In other words, the duration of the purge steps and the flow rate of purge gas is selected to be sufficiently low as to ensure that not all precursor has been removed from the reaction chamber after the purge step has finished. In other words, the duration of the purge steps and purge gas flow rates used therein can be sufficiently low such that the entire reaction chamber is not evacuated during a purge step. In some embodiments, the reactant is used as a purge gas.

In some embodiments, the duration of the precursor pulse, i.e. the precursor feed time, is from at least 0.25 s to at most 4.0 s, or from at least 0.5 s to at most 2.0 s, or from at least 1.0 s to at most 1.5 s.

In some embodiments, the duration of the intra-cycle purge is from at least 0.025 s to at most 2.0 s, or from at least 0.05 s to at most 0.8 s, or from at least 0.1 s to at most 0.4 s, or from at least 0.2 s to at most 0.3 s.

In some embodiments, the RF on time, i.e. the duration of a plasma pulse, that is the time during which RF power is provided during a plasma pulse, is from at least 0.5 s to at most 4.0 s, or from at least 0.7 s to at most 3.0 s, or from at least 1.0 s to at most 2.0 s, or from at least 1.25 s to at most 1.75 s, or of about 1.5 s.

In some embodiments, the inter-cycle purge has a duration from at least 0.1 s to at most 2.0 s, or from at least 0.1 to at most 1.5 s for example 1.0 s.

The silicon precursor comprises silicon and a halogen. In some embodiments, the silicon precursor has a general formula of $Si_nH_{2n+2-m}X_m$, wherein X is a halogen, n is from at least 1 to at most 3, and m is from at least 1 to at most 2n+2. 3. In some embodiments, the halogen is selected from F, Cl, Br, and I. In other words, and in some embodiments, the silicon precursor is a halogenated silane.

In some embodiments, the silicon precursor has a general formula of $Si_nH_{2n+2-m}I_m$, wherein n is from at least 1 to at most 3, and m is from at least 1 to at most 2n+2. 5. In some embodiments, the silicon precursor comprises $SiI_2H_2$. In some embodiments, the silicon precursor consists of $SiI_2H_2$.

In some embodiments, the silicon precursor substantially consists or substantially consists of silicon, hydrogen, and one or more halogens. It shall be understood that, when the silicon precursor consists of certain components, other components may, in some embodiments, still be present in small quantities, e.g. as contaminants.

The reactant comprises a noble gas. Suitably, the noble gas can be selected from the group consisting of He, Ne, Ar, and Kr. In some embodiments, the noble gas essentially consists of Ar. In some embodiments, the reactant comprises the noble gas and $H_2$. It shall be understood that when a noble gas such as argon is used as a reactant, the noble gas is not substantially incorporated in the gap filling fluid. This notwithstanding, when the reactant comprises $H_2$, hydrogen comprised in the reactant may be incorporated in the gap filling fluid.

In some embodiments, all gases supplied to the reaction space throughout the present methods for filling a gap are the precursor, the reactant, an optional carrier such as Ar, and/or He, and an optional plasma ignition gas which can be or can include Ar, He, and/or $H_2$. In other words, no other gasses are provided to the reaction chamber than those listed, in these embodiments. In some embodiments, the carrier gas and/or the plasma ignition gas functions as a reactant.

In some embodiments, the precursor pulse comprises providing a silicon precursor to the reaction chamber by means of a carrier gas comprising a noble gas, and the plasma pulse comprises generating a plasma in the reaction chamber. In some embodiments, no gas flows in or out of the reaction chamber during the plasma pulse. It shall be understood that in such embodiments, the precursor pulse and the plasma pulse are not separated by a purge. Thus, in some embodiments, the reactant is a carrier gas. It shall be understood that a carrier gas refers to a gas that carries, or entrains, a precursor to the reaction chamber. An exemplary carrier gas includes a noble gas such as argon. Exemplary carrier gas flow rates are of at least 0.1 slm to at most 10 slm, or of at least 0.1 slm to at most 0.2 slm, or of at least 0.2 slm to at most 0.5 slm, or of at least 0.5 slm to at most 1.0 slm, or of at least 1.0 slm to at most 2.0 slm, or of at least 2.0 slm to at most 5.0 slm, or of at least 5.0 slm to at most 10.0 slm, or of at least 0.1 slm to at most 2 slm. These exemplary carrier gas flow rates are provided for the case when the substrate is a 300 mm wafer. Flow rates for other wafer sizes can be trivially derived from these flow rates.

In some embodiments, the plasma pulses comprise generating an RF plasma in the reaction chamber. In some embodiments, a plasma power of at least 10 W to at most 500 W is used during the plasma pulses. In some embodiments, a plasma power of at least 20 W to at most 150 W is used during the plasma pulses. In some embodiments, a plasma power of at least 30 W to at most 100 W is used during the plasma pulses. In some embodiments, a plasma power of at least 35 W to at most 75 W is used during the plasma pulses. In some embodiments, a plasma power of at least 40 W to at most 50 W is used during the plasma pulses.

In some embodiments, the method is executed in a system comprising two electrodes between which the substrate is positioned. The electrodes are positioned parallel at a predetermined distance called an electrode gap. In some embodiments, the electrode gap is at least 5 mm to at most 30 mm, at least 5 mm to at most 10 mm, or at least 10 mm to at most 20 mm, or of at least 20 mm to at most 30 mm.

In some embodiments, a plasma frequency of at least 40 kHz to at most 2.45 GHz is used during the plasma pulses, or a plasma frequency of at least 40 kHz to at most 80 kHz is used during the plasma pulses, or a plasma frequency of at least 80 kHz to at most 160 kHz is used during the plasma pulses, or a plasma frequency of at least 160 kHz to at most 320 kHz is used during the plasma pulses, or a plasma frequency of at least 320 kHz to at most 640 kHz is used during the plasma pulses, or a plasma frequency of at least 640 kHz to at most 1280 kHz is used during the plasma pulses, or a plasma frequency of at least 1280 kHz to at most 2500 kHz is used during the plasma pulses, or a plasma frequency of at least 2.5 MHz to at least 5 MHz is used during the plasma pulses, or a plasma frequency of at least 5 MHz to at most 50 MHz is used during the plasma pulses, or a plasma frequency of at least 5 MHz to at most 10 MHz is used during the plasma pulses, or a plasma frequency of at least 10 MHz to at most 20 MHz is used during the plasma pulses, or a plasma frequency of at least 20 MHz to at most 30 MHz is used during the plasma pulses, or a plasma frequency of at least 30 MHz to at most 40 MHz is used during the plasma pulses, or a plasma frequency of at least 40 MHz to at most 50 MHz is used during the plasma pulses, or a plasma frequency of at least 50 MHz to at most 100 MHz is used during the plasma pulses, or a plasma frequency of at least 100 MHz to at most 200 MHz is used during the plasma pulses, or a plasma frequency of at least 200 MHz to at most 500 MHz is used during the plasma pulses, or a plasma frequency of at least 500 MHz to at most 1000 MHz is used during the plasma pulses, or a plasma frequency of at least 1 GHz to at most 2.45 GHz is used during the plasma pulses. In exemplary embodiments, the plasma is an RF plasma, and RF power is provided at a frequency of 13.56 MHz.

In some embodiments, the present methods are executed at a temperature of at least −25° C. to at most 200° C. In some embodiments, the present methods are executed at a temperature of at least −25° C. to at most 0° C. In some embodiments, the present methods are executed at a temperature of at least 0° C. to at most 25° C. In some embodiments, the present methods are executed at a temperature of at least 25° C. to at most 50° C. In some embodiments, the present methods are executed at a temperature of at least 50° C. to at most 75° C. In some embodiments, the present methods are executed at a temperature of at least 75° C. to at most 150° C. In some embodiments, the present methods are executed at a temperature of at least 150° C. to at most 200° C. This enhances the gap filling properties of the presently provided gap filling fluids. In some embodiments, the reaction chamber is at a temperature of at least 70° C. to at most 90° C.

In some embodiments, a volatile precursor is polymerized within a certain parameter range mainly defined by partial pressure of precursor during a plasma strike, wafer temperature, and total pressure in the reaction chamber. In order to adjust the "precursor partial pressure," an indirect process parameter (dilution gas flow) may be used to control the precursor partial pressure. The absolute number of precursor partial pressure may not be required in order to control flowability of deposited film, and instead, a ratio of flow rate of precursor to flow rate of the remaining gas and the total pressure in the reaction space at a reference temperature and total pressure can be used as practical control parameters. The above notwithstanding, and in some embodiments, the reaction chamber is maintained at a pressure of at least 600 Pa to at most 10000 Pa. For example, the pressure in the reaction chamber may be maintained at a pressure of at least 600 Pa to at most 1200 Pa, or at a pressure of at least 1200 Pa to at most 2500 Pa, or at a pressure of at least 2500 Pa to at most 5000 Pa, or at a pressure of at least 5000 Pa to at most 10000 Pa.

In some embodiments, the present methods are executed at a pressure of at least 500 Pa, preferably at a pressure of at least 700 Pa. More preferably, the present methods are executed at a pressure of at least 900 Pa. This enhances the gap filling properties of the presently provided gap filling fluids.

In some embodiments, the reaction chamber is maintained at a pressure of at least 500 Pa to at most 1500 Pa, and the reaction chamber is maintained at a temperature of at least 50° C. to at most 150° C. In some embodiments, the present methods are executed at a pressure of at least 500 Pa to at most 10 000 Pa and at a temperature of at least 50° C. to at most 200° C. In some embodiments, the present methods are executed at a pressure of at least 700 Pa and at a temperature of at least 50° C. to at most 150° C. In some embodiments, the present methods are executed at a pressure of at least 900 Pa, and at a temperature of at least 50° C. to at most 75° C.

In some embodiments, the methods are executed using a system comprising a precursor source which comprises a precursor recipient, e.g. a precursor canister, a precursor bottle, or the like; and one or more gas lines operationally connecting the precursor recipient to the reaction chamber. In such embodiments, the precursor recipient may be suitably maintained at a temperature which is from at least 5° C. to at most 50° C. lower than the temperature of the reaction chamber, or at a temperature which is from at least 5° C. to at most 10° C. lower than the temperature of the reaction chamber, or at a temperature which is from at least 10° C. to at most 20° C. lower than the temperature of the reaction chamber, or at a temperature which is from at least 30° C. to at most 40° C. lower than the temperature of the reaction chamber, or at a temperature which is from at least 40° C. to at most 50° C. lower than the temperature of the reaction chamber. The gas lines may be suitably maintained at a temperature between the temperature of the precursor recipient and the reaction chamber. For example, the gas lines may be maintained at a temperature which is from at least 5° C. to at most 50° C., or from at least 5° C. to at most 10° C., or from at least 10° C. to at most 20° C., or from at least 30° C. to at most 40° C., or from at least 40° C. to at most 50° C. lower than the temperature of the reaction chamber. In some embodiments, at least a part of the gas lines and the reaction chamber are maintained at a substantially identical temperature which is higher than the temperature of the precursor recipient.

In some embodiments, the substrate rests on a susceptor in the reaction chamber while the gap filling fluid is formed, and the susceptor temperature is from at least 50° C. to at most 100° C., or from at least 60° C. to at most 80° C., or from at least 65° C. to at most 75° C.

Flowable films may be temporarily obtained when a volatile precursor is polymerized by a plasma and deposited on a surface of a substrate, wherein gaseous precursor (e.g. monomer) is activated or fragmented by energy provided by plasma gas discharge so as to initiate polymerization, and when the resultant material is deposited on the surface of the substrate, the material shows temporarily flowable behavior. In accordance with exemplary embodiments, when the deposition step is complete, the flowable film is no longer flowable but is solidified, and thus, a separate solidification process is not required. In other embodiments, the flowable film is densified and/or solidified after deposition. Densifying and/or solidifying the flowable film can be done by means of a curing step (also called "cure").

Accordingly, in some embodiments, the method includes a step of curing the gap filling fluid. This step increases the thermal resistance of the gap filling fluid. In other words, it increases the resistance of the gap filling fluid against deformation and/or mass loss at elevated temperatures. Additionally or alternatively, the curing step may cause the gap filling fluid to solidify.

In some embodiments, the gap filling fluid is cured after it has been deposited. Optionally, the gap filling fluid is subjected to an anneal after the gap filling fluid has been deposited and before the curing step. Suitable annealing times include from at least 10.0 seconds to at most 10.0 minutes, for example from at least 20.0 seconds to at most 5.0 minutes, for example from at least 40.0 seconds to at most 2.5 minutes. Suitably, the anneal is performed in a gas mixture comprising one or more gasses selected from the list consisting of $N_2$, He, Ar, and $H_2$. In some embodiments, the anneal is carried out at a temperature of at least 200° C., or at a temperature of at least 250° C., or at a temperature of at least 300° C., or at a temperature of at least 350° C., or at a temperature of at least 400° C., or at a temperature of at least 450° C.

In some embodiments, the gap filling fluid may be cured during deposition, e.g. by cyclically alternating deposition pulses and curing pulses. Thus, in some embodiments, a method as described herein comprises one or more super cycles. A super cycle comprises a step of executing the cyclical deposition process and a curing step. When the super cycle is repeated several times, a cyclical process results. When the presently disclosed methods comprise only one super cycle, a process results in which gap fill fluid is first deposited, and cured thereafter.

In some embodiments, a curing step comprises generating a plasma in the reaction chamber, thus exposing the substrate to a direct plasma. Suitable direct plasmas comprise noble gas plasmas. When a direct plasma is used, a thin layer of gap filling fluid may be efficiently cured, yielding a thin high-quality layer. In some embodiments, especially when a thicker layer of cured gap filling fluid is desired, the method for filling a gap may comprise a plurality of cycles in which gap filling fluid deposition steps and curing steps employing a direct plasma treatment are alternated. In such embodiments, the process of filling a gap preferably comprises a plurality of cycles and gap filling fluid deposition and plasma treatment steps, also called pulses, are alternated. Such a cyclic process has the advantage that a larger portion of the gap filling fluid is cured: a direct plasma can have a penetration depth of around 2 to 7 nm, such that a post deposition direct plasma treatment would only cure a top layer of the gap filling fluid. Conversely, alternating deposition and plasma steps allows curing a larger part, or even the entirety of the gap filling fluid, even when using a curing technique that can have a low penetration depth, such as a direct plasma.

Suitable plasma treatments include a $H_2$ plasma, a He plasma, a $H_2$/He plasma, an Ar plasma, an Ar/$H_2$ plasma, and an Ar/He/$H_2$ plasma. It shall be understood that a $H_2$ plasma refers to a plasma that employs $H_2$ as a plasma gas. Also, it shall be understood that a $H_2$/He plasma refers to a plasma that employs a mixture of $H_2$ and He as a plasma gas. It shall be understood that other plasmas are defined analogously.

In some embodiments, a curing step comprises providing a remote plasma, e.g. a remote noble gas plasma, and exposing the substrate to one or more excited species such as at least one of radicals, ions, and UV radiation. In some embodiments, the step of curing comprises the use of an indirect plasma after the gap has been filled with the gap filling fluid. An indirect plasma can have a larger penetration depth than a direct plasma, thereby obviating the need for cyclic deposition and curing steps. Thus, an indirect plasma cure may be applied post deposition.

In some embodiments, the step of curing comprises providing a remote plasma source, and positioning one or more mesh plates between the remote plasma source and the substrate. Thus, the substrate can be exposed to radicals generated by the remote plasma source. The radicals have a penetration depth which is significantly higher than the penetration length offered by direct plasmas, e.g. significantly higher than the size of the gaps to be filled by means of the presently provided methods. Consequently, a remote plasma treatment may be advantageously applied once after all the gap filling fluid has been deposited. This notwithstanding, a remote plasma cure may also be applied cyclically with alternating plasma cure and gap filling fluid deposition steps, similar to the operation with a direct plasma. The large penetration depths of remote plasmas has the advantage that they allow efficient curing of gap filling fluid. In some embodiments, the plasma gas employed in a remote plasma comprises a noble gas, for example a noble gas selected from the list consisting of He and Ar.

The step of curing may reduce the hydrogen concentration of the gap filling fluids with respect to their uncured state. For example, the hydrogen concentration is reduced by at least 0.01 atomic percent to at most 0.1 atomic percent, or by at least 0.1 atomic percent to at most 0.2 atomic percent, or by at least 0.2 atomic percent to at most 0.5 atomic percent, or by at least 0.5 atomic percent to at most 1.0 atomic percent, or by at least 1.0 atomic percent to at most 2.0 atomic percent, or by at least 2.0 atomic percent to at most 5.0 atomic percent, or by at least 5.0 atomic percent to at most 10.0 atomic percent.

In some embodiments, the step of curing comprises exposing the gap filling fluid to a micro pulsed plasma. The application of a micro-pulsed plasma can be particularly advantageous since the as-deposited gap filling fluid comprises hydrogen. A micro pulsed plasma is a plasma treatment that comprises the application of a plurality of rapidly succeeding on-off micro pulses. The micro pulsed plasma may, for example, employ a noble gas as a plasma gas. When a 300 mm wafer is used as a substrate, a plasma gas flow rate of, for example, at least 5.0 slm, or of at least 5.0 slm to at most 7.0 slm, or of at least 7.0 slm to at most 10.0 slm is maintained during the micro pulsed plasma. For example, the on micro pulses in a micro pulsed plasma may last from at least 1.0 ps to at most 1.0 s, or from at least 2.0 µs to at most 0.50 s, or from at least 5.0 µs to at most 250 ms, or from at least 10.0 µs to at most 100.0 ms, or from at least 25.0 µs to at most 50.0 ms, or from at least 50.0 µs to at most 25.0 ms, or from at least 100.0 µs to at most 10.0 ms, or from at least 250.0 µs to at most 5.0 ms, or from at least 0.50 ms to at most 2.5 ms. For example, the off micro pulses in a micro pulsed plasma may last from at least 1.0 µs to at most 2.0 s, or from at least 2.0 µs to at most 1.0 s, or from at least 5.0 µs to at most 500 ms, or from at least 10.0 µs to at most 250.0 ms, or from at least 25.0 µs to at most 100.0 ms, or from at least 50.0 µs to at most 50.0 ms, or from at least 100.0 µs to at most 25.0 ms, or from at least 200.0 µs to at most 10.0 ms, or from at least 500.0 µs to at most 5.0 ms, or from at least 1.0 ms to at most 2.0 ms. A micro pulsed plasma may be used cyclically, i.e. as a plasma pulse in a cyclical deposition treatment, and/or as a post-deposition treatment. In other words, a process of filling a gap may comprise alternating cycles of gap filling fluid deposition and micro pulsed plasma. Additionally or alternatively, the substrate may be subjected to a micro pulsed plasma post-deposition treatment after all gap filling fluid has been deposited.

In some embodiments, the substrate is subjected to a micro pulsed plasma while a plasma gas is provided to the reaction chamber at a flow rate that is higher than a predetermined threshold. The combination of a micro pulsed plasma with these high flow rates minimizes redeposition of volatile by products released during plasma-induced cross linking of the deposited gap filling fluid. In some embodiments, the flow rate of the plasma gas during micro pulsed plasma treatment is at least 5.0 slm (standard liter per minute), preferably at least 10.0 slm. The skilled artisan understands that this flow rate depends on reaction chamber volume and substrate size, and the values provided here for 300 mm wafers and a reaction chamber volume of 1 liter can be readily transferred to other substrate sizes and/or reactor volumes. In some embodiments, a noble gas is used as a plasma gas during micro pulsed plasma treatment. In some embodiments, the noble gas is selected from the list consisting of He and Ar.

In some embodiments, the step of curing involves the use of ultraviolet (UV) light. In other words, the step of curing may involve exposing the substrate, including the gap filling fluid, to UV radiation. Such a curing step employing UV light may be called a UV cure.

In some embodiments, a UV cure is used as a post-deposition treatment. In other words, in some embodiments, the present methods can comprise depositing a gap filling fluid, and after all gap filling fluid has been deposited, subjecting the gap filling fluid to a UV cure.

In some embodiments, the present methods comprise a cyclic process comprising a plurality of cycles, the cycles each comprising a gap filling fluid deposition step and a UV curing step. The UV curing step may be separated by a purge step. Additionally or alternatively, subsequent cycles may be separated by a purge step. Suitable purge steps are described elsewhere herein.

In an exemplary embodiment, an exemplary curing step is discussed. The curing step may employ a continuous direct plasma for 20 seconds. Gap filling fluid deposition steps and direct plasma curing steps may be carried out cyclically, i.e. gap filling fluid deposition steps and curing steps may be executed alternatingly. This allows efficiently curing all, or at least a large portion, of the gap filling fluid. For curing gap filling fluid in gaps on a 300 mm substrate, each direct plasma curing step can feature, for example, 20 seconds of He plasma at an RF power of 200 W and a working pressure of 600 Pa. The reactor volume is ca. 1 liter and the He flow rate is 2 slm.

As a further exemplary embodiment, another exemplary curing step is discussed. The curing step may involve exposing the gap filling fluid to a micro pulsed plasma. In the present example, the curing step may be carried out cyclically, i.e. alternating cycles of gap filling fluid deposition and micro pulsed RF plasma are employed, though a post-deposition micro pulsed plasma curing treatment is possible as well. The application of cyclic gap filling fluid deposition and plasma steps allows efficiently curing all, or at least a large portion, of the gap filling fluid. For curing gap filling fluid in gaps on a 300 mm substrate, each direct curing step may feature 200 micropulses comprising 0.1 seconds of plasma on time and 0.5 seconds of plasma off time. The curing step may employ a He plasma at 400 Pa. The RF power provided may be 200 W. A He flow of 10 slm may be employed.

In some embodiments, the present methods further comprise depositing a cap layer on the gap filling fluid. In some embodiments, the present methods further comprise depositing a cap layer on the cured gap filling fluid. Methods for depositing a cap layer are described in more detail elsewhere herein.

Further described herein is a system. The system comprises a reaction chamber, a radio frequency power source, a gas injection system, a precursor gas source, a reactant gas source, an exhaust, and a controller. The reaction chamber comprises a substrate support and an upper electrode. The substrate support comprises a lower electrode. The radio frequency power source is arranged for generating a radio frequency power waveform. The gas injection system is in fluid connection with the reaction chamber. The precursor gas source is arranged for introducing a silicon precursor into the reaction chamber. Optionally, the silicon precursor is introduced in the reaction chamber by means of a carrier gas. The reactant gas source is arranged for introducing a reactant in the reaction chamber. The exhaust is suitably arranged for removing reaction products and unused reactants from the reaction chamber. The controller is programmed or otherwise configured to cause the methods described elsewhere herein to be conducted. The controller(s) communicate with the various power sources, heating systems, pumps, robotics, and gas flow controllers or valves of the system, as will be appreciated by the skilled artisan.

In some embodiments, the precursor source that comprises a precursor recipient, e.g. a precursor canister, a precursor bottle, or the like; and one or more gas lines operationally connecting the precursor recipient to the reaction chamber. In such embodiments, the precursor recipient may be suitably maintained at a temperature which is from at least 5° C. to at most 50° C. lower than the temperature of the reaction chamber, or at a temperature which is from at least 5° C. to at most 10° C. lower than the temperature of the reaction chamber, or at a temperature which is from at least 10° C. to at most 20° C. lower than the temperature of the reaction chamber, or at a temperature which is from at least 30° C. to at most 40° C. lower than the temperature of the reaction chamber, or at a temperature which is from at least 40° C. to at most 50° C. lower than the temperature of the reaction chamber. The gas lines may be suitably maintained at a temperature between the temperature of the precursor recipient and the reaction chamber. For example, the gas lines may be maintained at a temperature which is from at least 5° C. to at most 50° C., or from at least 5° C. to at most 10° C., or from at least 10° C. to at most 20° C., or from at least 30° C. to at most 40° C., or from at least 40° C. to at most 50° C. lower than the temperature of the reaction chamber. In some embodiments, the gas lines and the reaction chamber are maintained at a substantially identical temperature which is higher than the temperature of the precursor recipient.

In some embodiments, the gas injection system comprises a precursor delivery system that employs a carrier gas for carrying the precursor to one or more reaction chambers. In some embodiments, continuous flow of carrier gas is accomplished using a flow-pass system. In the flow-pass system, a carrier gas line is provided with a detour line having a precursor reservoir (bottle), and the main line and the detour line are switched, wherein when only a carrier gas is intended to be fed to a reaction chamber, the detour line is closed, whereas when both the carrier gas and the precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line.

The presently provided methods may be executed in any suitable apparatus, including in a reactor as shown in FIG. 1. Similarly, the presently provided structures may be manufactured in any suitable apparatus, including a reactor as shown in FIG. 1. FIG. 1 is a schematic view of a plasma-enhanced atomic layer deposition (PEALD) apparatus, desirably in conjunction with controls programmed to conduct the sequences described below, usable in some embodiments of the present invention. In this figure, by providing a pair of electrically conductive flat-plate electrodes (2,4) in parallel and facing each other in the interior (11) (reaction zone) of a reaction chamber (3), applying RF power (e.g. at 13.56 MHz and/or 27 MHz) from a power source (25) to one side, and electrically grounding the other side (12), a plasma is excited between the electrodes. A temperature regulator may be provided in a lower stage (2), i.e. the lower electrode. A substrate (1) is placed thereon and its temperature is kept constant at a given temperature. The upper electrode (4) can serve as a shower plate as well, and a reactant gas and/or a dilution gas, if any, as well as a precursor gas can be introduced into the reaction chamber (3) through a gas line (21) and a gas line (22), respectively, and through the shower plate (4). Additionally, in the reaction chamber (3), a circular duct (13) with an exhaust line (7) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6). In some embodiments, depositing the gap filling fluid and curing the gap filling fluid is done in one and the same reaction chamber. In some embodiments, depositing the gap filling fluid and curing the gap filling fluid is done in separate reaction chambers comprised in one and the same system.

Figure 2:
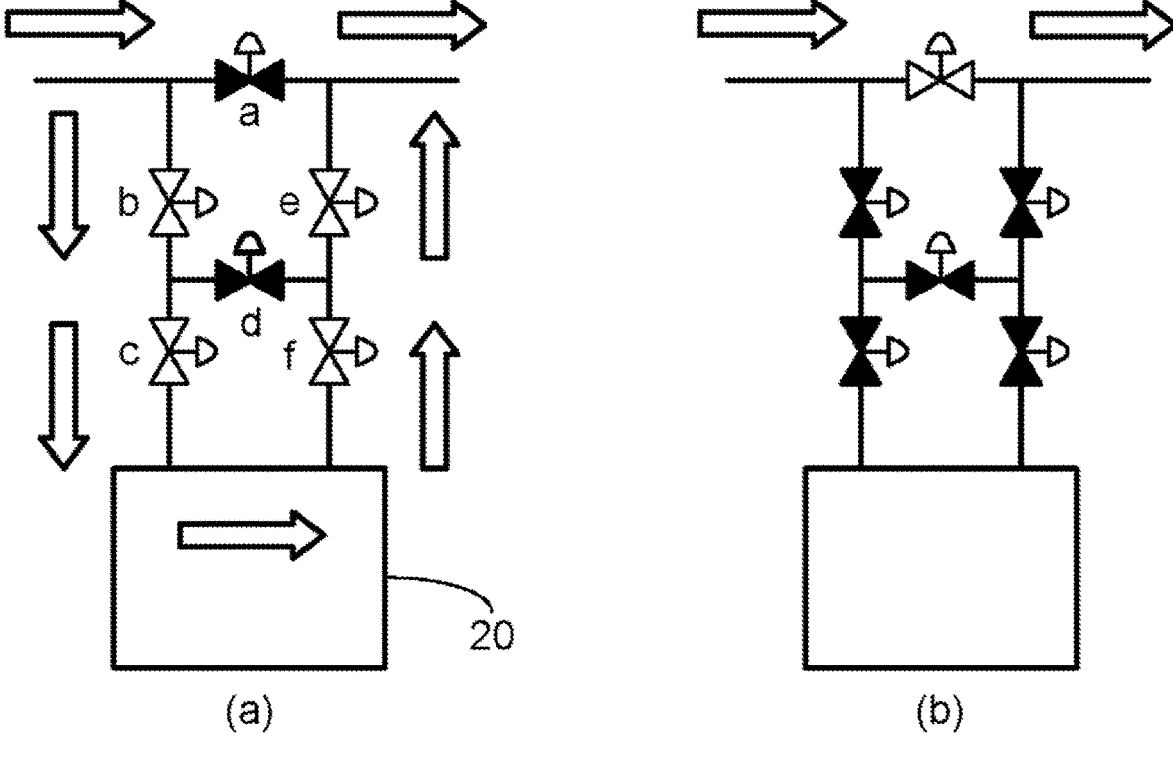
FIG. 2 illustrates a schematic representation of a precursor supply system using a flow-pass system (FPS) usable in accordance with at least one embodiment of the present disclosure.

In some embodiments, the system of switching flow of an inactive gas and flow of a precursor gas illustrated in FIG. 2 can be used in an apparatus according to FIG. 1 to introduce the precursor gas in pulses without substantially fluctuating pressure of the reaction chamber.

Indeed, a continuous flow of the carrier gas can be accomplished using a flow-pass system (FPS) wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line.

FIG. 2 illustrates a precursor supply system using a flow-pass system (FPS) that can be used in an embodiment of a system as described herein (black valves indicate that the valves are closed). As shown in (a) in FIG. 2, when feeding a precursor to a reaction chamber (not shown), first, a carrier gas such as Ar (or He) flows through a gas line with valves b and c, and then enters a bottle (reservoir) (20). The carrier gas flows out from the bottle (20) while carrying a precursor gas in an amount corresponding to a vapor pressure inside the bottle (20) and flows through a gas line with valves f and e and is then fed to the reaction chamber together with the precursor. In the above, valves a and d are closed. When feeding only the carrier gas (which can be a noble gas such as He or Ar) to the reaction chamber, as shown in (b) in FIG. 2, the carrier gas flows through the gas line with the valve a while bypassing the bottle (20). In the above, valves b, c, d, e, and f are closed.

A skilled artisan will appreciate that the apparatus includes one or more controller(s) (not shown) programmed or otherwise configured to cause the deposition process described elsewhere herein to be conducted. The controller(s) communicate with the various power sources, heating systems, pumps, robotics and gas flow controllers or valves of the reactor, as will be appreciated by the skilled artisan. The controller(s) include electronic circuitry including a processor, and software to selectively operate valves, manifolds, heaters, pumps and other components included in the system. Such circuitry and components operate to introduce precursors, reactants, and optionally purge gases from the respective sources (e.g., bottle 20). The controller can control timing of gas supply sequences, temperature of the substrate and/or reaction chamber (3), pressure within the reaction chamber (3), and various other operations to provide proper operation of the system. The controller(s) can include control software to electrically or pneumatically control valves to control flow of precursors, reactants and purge gases into and out of the reaction chamber (3). Controller(s) can include modules such as a software or hardware component, e.g., a FPGA or ASIC, which performs certain tasks. It shall be understood that where the controller includes a software component to perform a certain task, the controller is programmed to perform that particular task. A module can advantageously be configured to reside on the addressable storage medium, i.e. memory, of the control system and be configured to execute one or more processes.

Optionally, a dual chamber reactor can be used. A dual chamber reactor comprises two sections or compartments for processing wafers disposed close to each other. In such a dual chamber reactor, a reactant gas and a noble gas can be supplied through a shared line and precursor-containing gases are provided by means of unshared lines. In exemplary embodiments, forming a gap filling fluid occurs in one of the two compartments, and the step of curing occurs in another reaction chamber. This can advantageously improve throughput, e.g. when gap filling fluid formation and curing occur at different temperatures, then gap filling fluid formation can be done in one reaction chamber and curing can be done in an adjacent reaction chamber.

Figure 3:
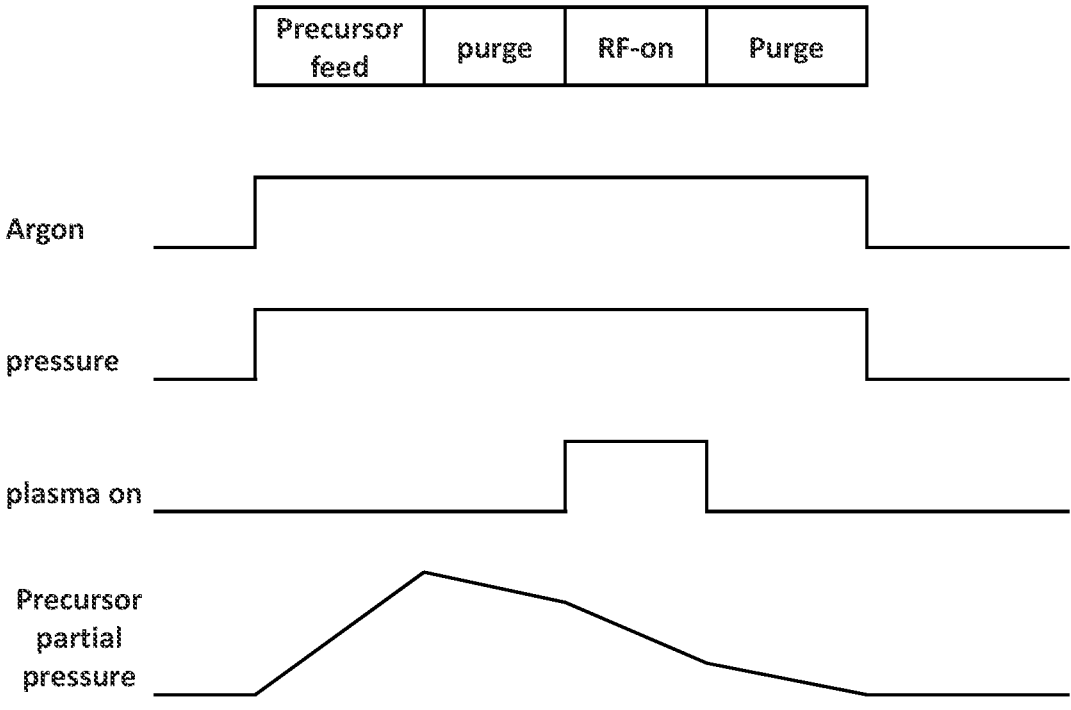
FIG. 3 shows a deposition cycle sequence of an exemplary gap filling fluid deposition process.

FIG. 3 shows a deposition cycle sequence of an exemplary gap filling fluid deposition process. The process employs a gas mixture consisting argon as a reactant. The reactant may be continuously provided to the reaction chamber at a constant flow rate. Precursor pulses and plasma pulses, i.e. RF on pulses, are applied sequentially, and are separated by purge pulses. The cycle can be repeated or more times. Thus, a silicon-containing material is deposited in the gap. The cycle can be repeated any number of times until a desired amount of silicon-containing material has been deposited in the gap.

Figure 4:
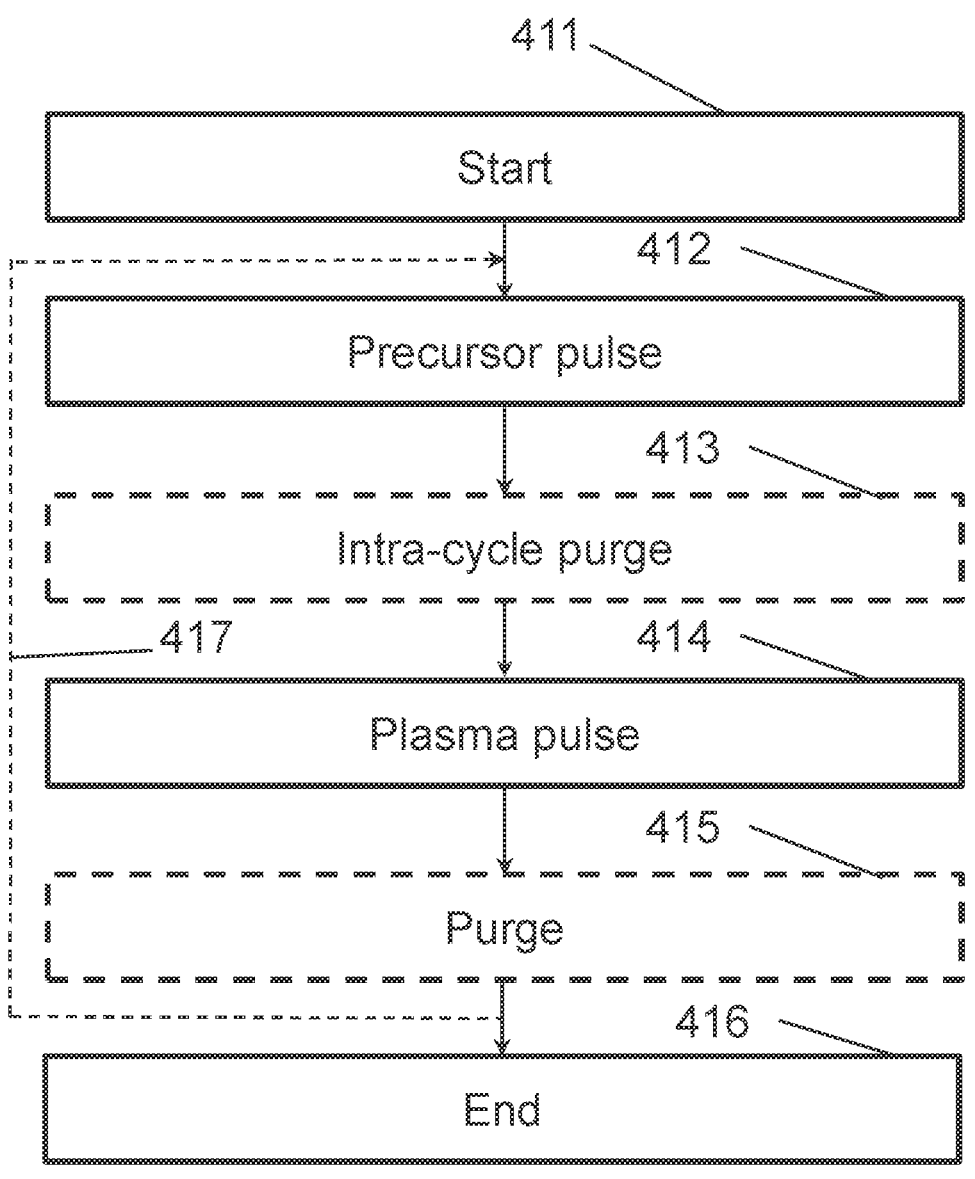
FIG. 4 shows a schematic representation of an embodiment a method for filling a gap.

FIG. 4 shows a schematic representation of an embodiment a method for filling a gap. The method starts (411) after providing a substrate to a reaction chamber, and comprises a precursor pulse (412) in which a silicon precursor is provided to a reaction chamber. Optionally, the reaction chamber is then purged (413). The method then comprises a plasma pulse (414) in which the substrate is subjected to a plasma treatment. Optionally, the reaction chamber is then purged in an inter-cycle purge (415). It shall be understood that no plasma is generated in the reaction chamber during the purges (413,415). Optionally, the steps from the precursor pulse (412) to the plasma pulse (414) are repeated (417) one or more times. Optionally, subsequent cycles are separated by an inter-cycle purge (415). Thus, a silicon-containing material is deposited in the gap. When a desired amount of silicon-containing material has been deposited in the gap, the method ends (416).

Figure 5:
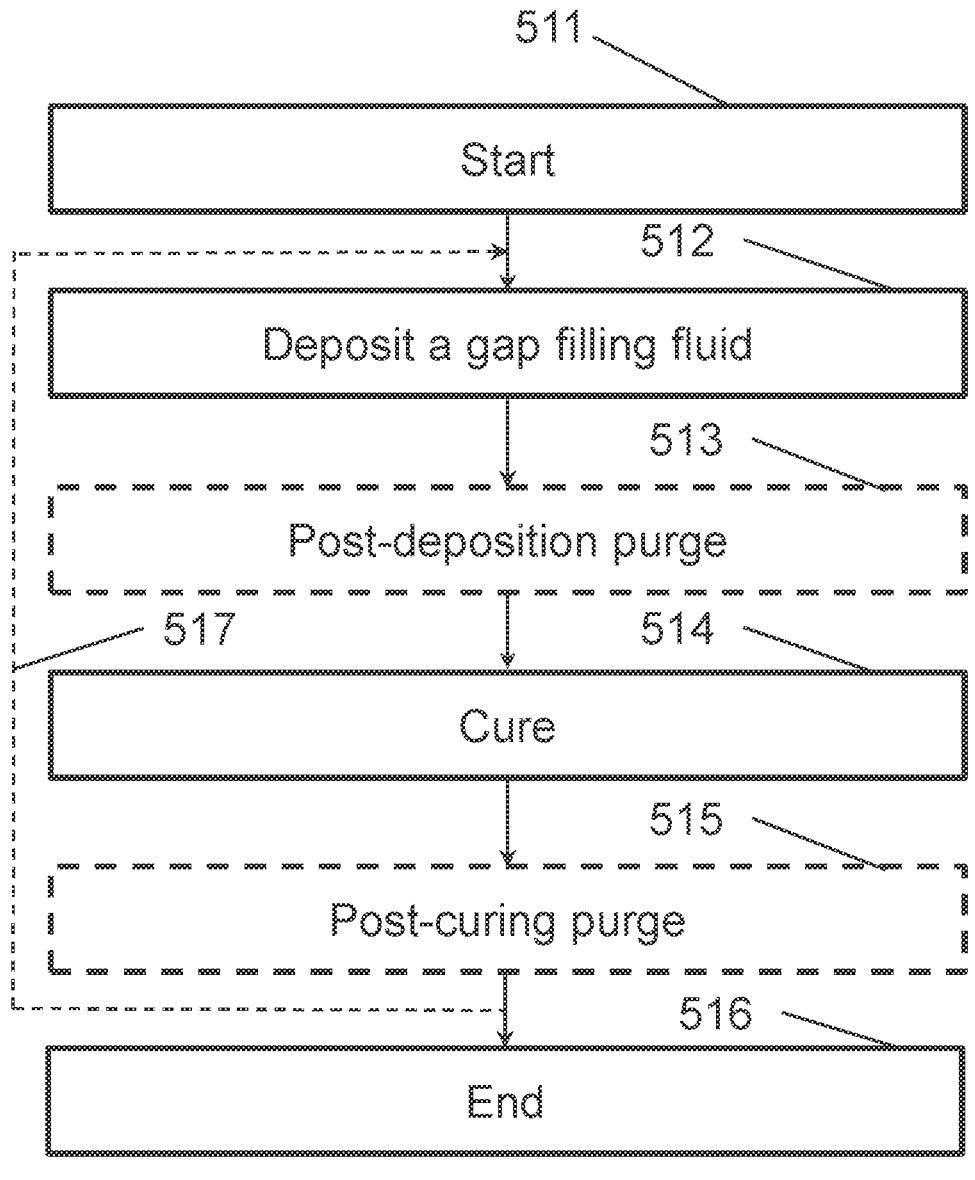
FIG. 5 shows a schematic representation of an embodiment of a method as disclosed herein.

FIG. 5 shows a schematic representation of an embodiment of a method as disclosed herein. The method starts (511) after providing a substrate to a reaction chamber. The method comprises a step (512) of depositing a gap filling fluid on the substrate. Optionally, the reaction chamber is then purged by means of a post-deposition purge (513). The method then comprises a step (514) of curing the gap filling fluid. Optionally, the reaction chamber is then purged by means of a post-cure purge (515). Optionally, the steps from the step (512) of depositing a gap filling fluid on the substrate to the step (514) of curing the gap filling fluid are repeated (517) one or more times. Optionally, subsequent cycles are separated by the post-cure purge (515). The resulting deposition-cure cycles can be repeated until a desired thickness of cured gap filling fluid has been deposited on the substrate. When a desired thickness has been reached, the method ends (516).

Figure 6:
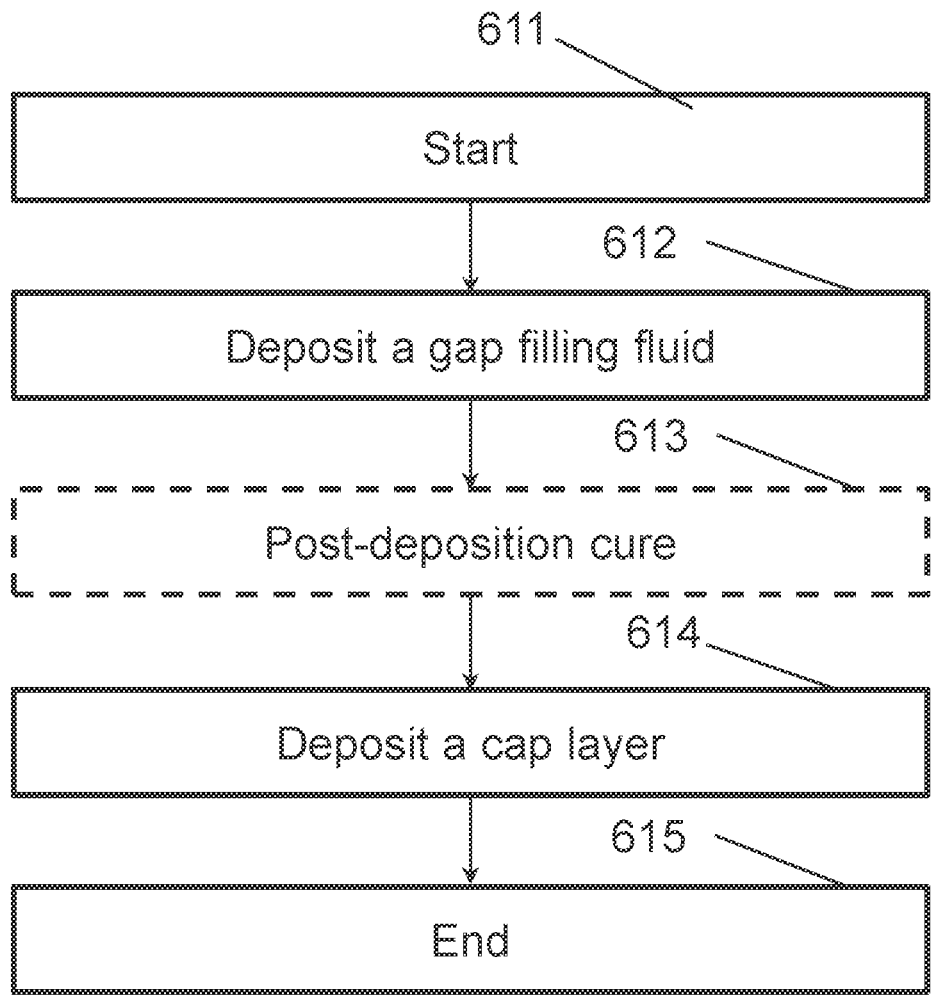
FIG. 6 shows a schematic representation of an embodiment of a method as disclosed herein.

FIG. 6 shows a schematic representation of a method as disclosed herein. The method starts (611) after providing a substrate to a reaction chamber. The method comprises a step (612) of depositing a gap filling fluid on the substrate. Optionally, the gap filling fluid is then cured by means of a post-deposition cure (613). Then, the method comprises a step (614) of depositing a cap layer on the gap filling fluid. After the cap layer has been deposited, the method ends (615). The cap layer can advantageously protect underlying gap filling fluid, e.g. against chemicals used in further processing steps, and/or against oxidation by atmospheric air.

In some embodiments, the step (614) of forming the cap layer comprises a cyclical deposition process that comprises a plurality of cycles, for example 2, 5, 10, 20, 50, 100, 200, 500, 1000, 2000, 5000, or 10000 cycles. A cycle comprises a sequence of a cap layer precursor pulse and a cap layer plasma pulse. Optionally, the cap layer precursor pulse and the cap layer plasma pulse are separated by an intra-cycle purge. Optionally, subsequent cycles are separated by an inter-cycle purge. The cap layer precursor pulse comprises providing a cap layer precursor to the reaction chamber. The cap layer plasma pulse comprises providing a cap layer reactant to the reaction chamber and generating a plasma in the reaction chamber. In some embodiments, the cap layer comprises silicon nitride. Suitable cap layer precursors include silicon-containing compounds such as halosilanes. In some embodiments, the cap layer precursor comprises a halosilane selected from a chlorosilane, a bromosilane, and an iodosilane. In some embodiments, the cap layer precursor comprises diiodosilane. In some embodiments, the cap layer reactant comprises a nitrogen-containing gas or gas mixture. Suitable reactants include $N_2$, mixtures of $N_2$ and $H_2$, and $NH_3$.

In some embodiments, the step (614) of forming the cap layer comprises simultaneously providing a cap layer precursor and a cap layer reactant to the reaction chamber while generating a plasma in the reaction chamber. In some embodiments, the cap layer comprises silicon nitride, in which case the cap layer precursor suitably comprises a silicon-containing compound such as a silane. In such embodiments, the cap layer precursor can comprise a compound selected from monosilane, disilane, and trisilane. In some embodiments, the cap layer precursor comprises monosilane. Suitable reactants include nitrogen-containing gasses or gas mixtures such as $N_2$ and $NH_3$.

In some embodiments, the cap layer comprises silicon carbide and the step (614) of forming the cap layer comprises simultaneously providing a cap layer precursor and a cap layer reactant to the reaction chamber while generating a plasma in the reaction chamber. In such embodiments, suitable cap layer precursors include carbon and silicon containing compounds such as alkyl-substituted silanes, i.e. alkylsilanes. A suitable alkylsilane incudes hexamethylsilane. Suitable cap layer reactants include noble gasses and gas mixtures comprising noble gasses, for example a gas mixture comprising a noble gas and hydrogen. A suitable cap layer reactant comprises Ar and $H_2$.

Although certain embodiments and examples have been discussed, it will be understood by those skilled in the art that the scope of the claims extend beyond the specifically disclosed embodiments to other alternative embodiments and/or uses and obvious modifications and equivalents thereof. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

In the present disclosure, where conditions and/or structures are not specified, the skilled artisan in the art can readily provide such conditions and/or structures in view of the present disclosure, as a matter of routine experimentation.

What is claimed is:

1. A method of filling a gap comprising:
introducing a substrate in a reaction chamber, the substrate being provided with a gap;
depositing a gap filling fluid on the substrate with a plurality of super cycles, a super cycle consisting of a deposition process cycle, a curing cycle, and a purge between the deposition process cycle and the curing cycle, wherein the deposition process cycle comprises:
introducing a silicon precursor into the reaction chamber, the silicon precursor comprising silicon and a halogen,
generating a direct plasma in the reaction chamber, and
introducing a reactant into the reaction chamber, wherein the reactant consists of one or more of He, Ne, Ar, and Kr;
wherein the curing cycle comprises, after depositing a gap filling fluid, curing the gap filling fluid, wherein curing the gap filled fluid comprises generating a plasma from a gas consisting of Ar,
whereby the silicon precursor and the reactant react in the presence of the plasma to form a gap filling fluid that at least partially fills the gap, wherein the gap filling fluid consists of silicon, the halogen, and hydrogen,
wherein the step of introducing the silicon precursor and the step of generating the plasma are separated by an intra-cycle purge, and
wherein the step of curing the gap filling fluid comprises generating a direct micro pulsed plasma with a flow rate of at least 10.0 slm of the gas consisting of Ar thereby minimizing redeposition of volatile by-products released during the formation of the gap filling fluid, wherein a RF on time of a pulse of the micro pulsed plasma lasts from at least 1 ps to at most 250 ms and a RF off time of the pulse of the micro pulsed plasma lasts from at least 1.0 µs to at most 500 ms.

2. The method according to claim 1 wherein the silicon precursor consists of compounds having a general formula of $Si_nH_{2n+2-m}X_m$, wherein X is the halogen, n is from at least 1 to at most 3, and m is from at least 1 to at most 2n+2.

3. The method according to claim 2, wherein the only gases provided to the reaction chamber during the method are the silicon precursor, and one or more of He, Ar, Ne, and Kr.

4. The method according to claim 1, wherein a plasma frequency during the deposition cycle is between 1000 MHz and 2.45 GHz.

5. The method according to claim 1, wherein the silicon precursor comprises $SiI_2H_2$.

6. The method according to claim 5, wherein the deposition process cycle is carried out at a temperature of at least −25° C. to at most 90° C. and a pressure of 500 Pa to 1500 Pa.

7. The method according to claim 1, wherein the RF on time of the pulse of the micro pulsed plasma lasts at most 2.5 ms.

8. The method according to claim 1, wherein a plasma frequency during the deposition cycle is between about 50 MHz and about 2.45 GHz.

9. The method according to claim 1, further comprising, after depositing the gap filling fluid, depositing a cap layer on the gap filling fluid, wherein the cap layer comprises a silicon nitride or silicon carbide.

10. The method according to claim 9, wherein the cap layer comprises silicon nitride, wherein the step of forming a cap layer on the gap filling fluid comprises a cyclical process comprising a plurality of cycles, a cycle comprising a cap layer precursor pulse and a cap layer plasma pulse, the cap layer precursor pulse comprising providing a cap layer precursor to the reaction chamber, the cap layer plasma pulse comprising providing a cap layer reactant to the reaction chamber, and the cap layer plasma pulse comprising generating a cap layer plasma in the reaction chamber, wherein the cap layer precursor comprises a silane and the cap layer reactant comprises ammonia.

11. The method according to claim 9, wherein the cap layer comprises silicon carbide, wherein the step of forming a cap layer on the gap filling fluid comprises a cyclical process comprising a plurality of cycles, a cycle comprising a cap layer precursor pulse and a cap layer plasma pulse, the cap layer precursor pulse comprising providing a cap layer precursor to the reaction chamber, the cap layer plasma pulse comprising providing a cap layer reactant to the reaction chamber, and the cap layer plasma pulse comprising generating a cap layer plasma in the reaction chamber, wherein the cap layer precursor comprises hexamethyldisilane.

12. The method according to claim 1, further comprising repeating the plurality of super cycles until a predetermined thickness of gap filling fluid is achieved, and wherein subsequent cycles of the plurality of super cycles are separated by an inter-cycle purge.

13. The method according to claim 1, wherein the reactant consists of Kr.

14. The method according to claim 1, wherein the RF off time of the pulse of the micro pulsed plasma lasts at most 2.0 ms.

15. The method according to claim 1, wherein the deposition cycle consists of introducing the silicon precursor, generating the plasma, introducing the reactant, and the intra-cycle purge.

16. The method of claim 1, wherein the reactant is flowed continuously into the reaction chamber during the deposition process cycle.

17. A method of filling a gap comprising:

introducing a substrate in a reaction chamber, the substrate being provided with a gap;

depositing a gap filling fluid by executing a cyclical deposition process comprising a plurality of super cycles, wherein a super cycle comprises a deposition cycle and a curing cycle, wherein the deposition cycle comprises a precursor pulse and a plasma pulse, wherein a curing cycle comprises curing the gap filling fluid, wherein curing the gap filled fluid comprises generating a plasma from a gas consisting of He, wherein the precursor pulse comprises introducing a silicon precursor into the reaction chamber, the silicon precursor comprising silicon and a halogen, wherein the plasma pulse comprises generating a plasma in the reaction chamber and introducing a reactant into the reaction chamber, wherein the reactant comprises a noble gas, whereby the silicon precursor and the reactant react in the presence of the plasma to form a gap filling fluid that at least partially fills the gap, the gap filling fluid comprising silicon and hydrogen; and wherein the precursor pulse and the plasma pulse are separated by an intra-cycle purge, and wherein the step of curing the gap filling fluid comprises generating a direct micro pulsed plasma with a flow rate of at least 10.0 slm of the gas consisting of He, thereby minimizing redeposition of volatile by-products released during the formation of the gap filling fluid, wherein a RF on time of a pulse of the micro pulsed plasma lasts from at least 1 ps to at most 250 ms and a RF off time of the pulse of the micro pulsed plasma lasts from at least 1.0 µs to at most 500 ms, and wherein an RF power during generating a direct micro pulsed plasma is 200 W.

* * * * *